United States Patent
Emori et al.

(10) Patent No.: US 6,214,639 B1
(45) Date of Patent: Apr. 10, 2001

(54) METHOD OF PRODUCING A SEMICONDUCTOR DEVICE

(75) Inventors: Masaomi Emori; Mitsuji Nunokawa; Kenichi Hiratsuka; Masanori Ishii; Hiroshi Kawakubo, all of Yamanashi (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 09/365,820

(22) Filed: Aug. 3, 1999

(30) Foreign Application Priority Data

Dec. 3, 1998 (JP) .................................. 10-343715

(51) Int. Cl.[7] .................................. H01L 21/48
(52) U.S. Cl. .......................... 438/106; 438/106
(58) Field of Search .................... 438/106, 111, 438/460, 118, 112, 167

(56) References Cited

U.S. PATENT DOCUMENTS 4,209,355 * 6/1980 Burns .................................. 156/630
5,434,094 * 7/1995 Kobiki et al. ........................ 438/167
5,919,713 * 7/1999 Ishii et al. ............................ 438/460

FOREIGN PATENT DOCUMENTS 57-49252    3/1982  (JP) .
4-116950    4/1992  (JP) .

* cited by examiner

Primary Examiner—David Nelms
Assistant Examiner—David Nhu
(74) Attorney, Agent, or Firm—Armstrong, Westerman, Hattori, McLeland & Naughton LLP

(57) ABSTRACT

A method of producing a semiconductor device including a step of forming separation grooves in scribing regions defined at boundary portions between a plurality of semiconductor-device forming portions formed on a top surface of a semiconductor substrate; a step of defining portions of the scribing regions in the semiconductor substrate as substrate connecting portions; and a step of cutting off the substrate connecting portions along the separation grooves, to thereby separate the plurality of semiconductor-device forming portions into chips. These production steps contribute to a higher working efficiency in a later assembling process and to improved mass-production.

15 Claims, 6 Drawing Sheets

METHOD OF PRODUCING A SEMICONDUCTOR DEVICE

BACKGROUND OF THE INVENTION

1. Field of the Invention

The present invention relates to producing semiconductor devices and, more particularly, to a technology useful at the time of separating a semiconductor wafer, after completion of a wafer process, into individual chips and installing the chips into respective packages.

2. Description of the Related Art

Conventionally, in installing the chips of semiconductor devices into packages in an assembling process, an automatic chip bonder is used to ensure mass-production capability and working efficiency.

Such a automatic chip bonder attaches chips, separated from a semiconductor wafer after completion of a wafer process, by a scribing process and a separation process, to the respective packages by die bonding, and bonds wires of gold, aluminum or the like between each chip and its associated package by wire bonding. For this process, the automatic chip bonder must precisely identify the position of each of the chips aligned on a plane, through pattern recognition of the outline of each chip and the positions of the electrodes. Accurate recognition of the position of each chip requires the regular alignment of the individual chips.

In other words, if the chips are not in a regular alignment, the automatic chip bonder cannot accurately recognize the chip position. This results in an installation of the individual chips in the respective packages at lower efficiency and lower mass-production.

One conventional way of coping with this problem is to form a thin insulating film or the like on the top surface of a semiconductor wafer in such a way as to link between chips prior to the use of an automatic chip bonder, to use the thin film to link the chips, to adhere the thin film to an extension tape while keeping the aligned state of the chips, then to cut the thin film to separate the individual chips, and to stretch the extension tape to widen the interval between the chips. The reason for using the extension tape is that a sufficient space between the chips facilitates the work of holding each chip with a pincette, a collet or the like in the assembling process.

In the following description, the term "chip" strictly means an individual semiconductor device separated from a semiconductor wafer, and a corresponding portion of a semiconductor wafer before separation is referred to as a "semiconductor-device forming portion" and will also be conveniently referred to as a "chip" unless confusion occurs.

Also, in the following description, the "top surface" of a semiconductor substrate (or wafer) specifically indicates the surface on which semiconductor devices are formed, unless otherwise particularly defined, and the surface of the opposite side is referred to as the "back surface" of a semiconductor substrate (or wafer).

Since, in the prior art as mentioned above, a thin insulating film or the like is used where individual chips (semiconductor-device forming portions) are to be linked, the thin film may be sheared if more stress than required is applied to the thin film during a process of treating the back surface of the semiconductor wafer (e.g., adjustment of the thickness of the semiconductor substrate, formation of electrode regions, and the like) or in a process up to the separation of the chips. This structure does not therefore have a sufficient strength.

Also, if the thin film is sheared before the intended chip separation, the individual chips are fed to an automatic chip bonder, and are improperly aligned. This results in a lower working efficiency in the assembling process and in a lower mass-production.

Further, this prior art needs space for forming a thin film for linkage of chips at the periphery of the top surface of each chip and, thus, requires a larger chip size accordingly. In other words, this prior art has such a disadvantage that the number of effective chips obtainable from a single semiconductor wafer becomes relatively smaller. This eventually leads to a lower mass-production, and thus improvement is needed.

SUMMARY OF THE INVENTION

Accordingly, it is an object of the present invention to provide a method of producing a semiconductor device, which can ensure a higher working efficiency in the assembling process and improved mass-production capability.

According to the present invention, there is provided a method of producing a semiconductor device, which comprises a first step of forming separation grooves in scribing regions defined at boundary portions between a plurality of semiconductor-device forming portions formed on a top surface of a semiconductor substrate; a second step of defining portions of the scribing regions in the semiconductor substrate as substrate connecting portions; and a third step of cutting off the substrate connecting portions along the separation grooves, to thereby separate the plurality of semiconductor-device forming portions into chips.

According to the semiconductor device producing method of this invention, a portion (substrate connecting portion) of a semiconductor substrate, which is relatively strong, is used where individual chips (semiconductor-device forming portions) are to be linked, and thus it is strong enough as a chip linking member. It is therefore possible to firmly link the individual chips until chip separation and to feed the individual chips to an automatic chip bonder, while being property aligned. This allows the automatic chip bonder to precisely identify each chip position, to thereby ensure an efficient installment of the chips into packages. Namely, it is possible to improve both the working efficiency in the assembling process and mass-production.

Further, unlike the prior art, since the present invention requires no space for forming a thin film for linkage of chips on the top surface of each chip, the chip size can accordingly be made smaller, and eventually the number of effective chips obtainable from a single semiconductor wafer can be increased. This contributes to a further improvement in the mass production efficiency.

Since the substrate connecting portion which is cut off at the time of chip separation is formed by a portion of the semiconductor substrate which is relatively strong, it does not appear easy to cut off the substrate connecting portion. Since the separation groove is formed in the scribing region defined in the portion corresponding to the substrate connecting portion, however, the substrate connecting portion can easily be cut off without applying large stress to the semiconductor substrate by, for example, merely applying slight force to the substrate connecting portion along the separation groove at the time of chip separation.

DETAILED DESCRIPTION OF THE PREFERRED EMBODIMENTS

Figure 1A:
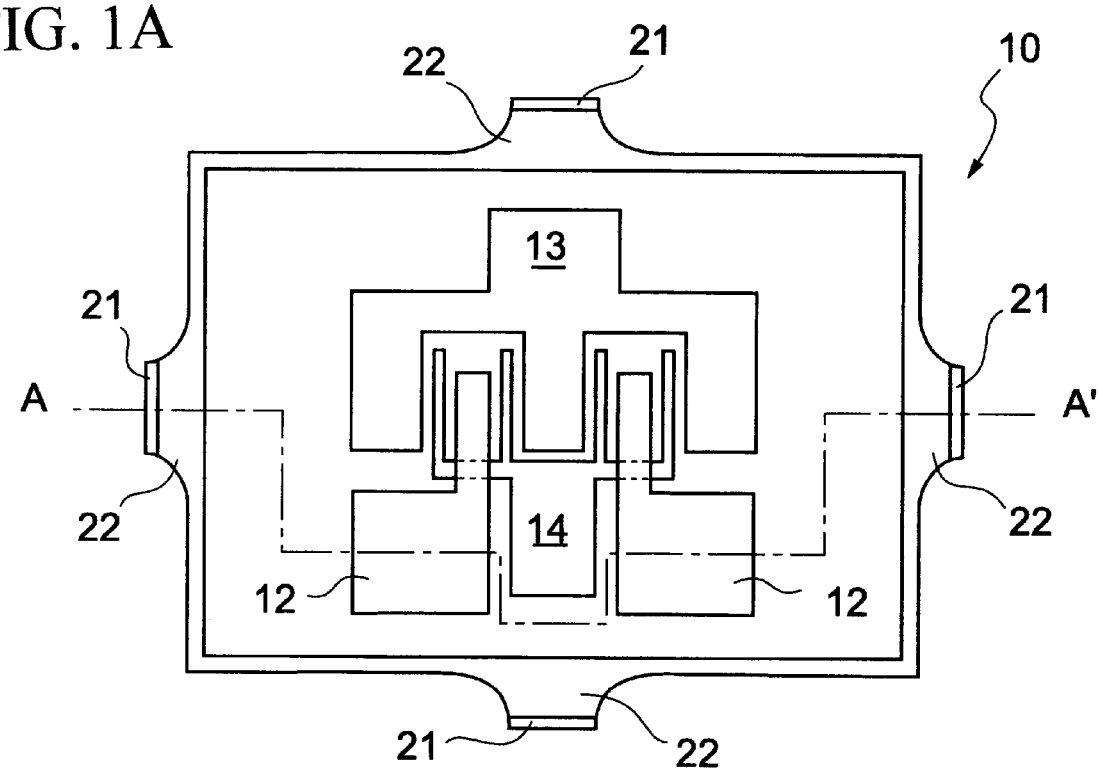
FIGS. 1A and 1B are diagrams schematically illustrating the structure of a semiconductor device according to one embodiment of the present invention.
Figure 1B:
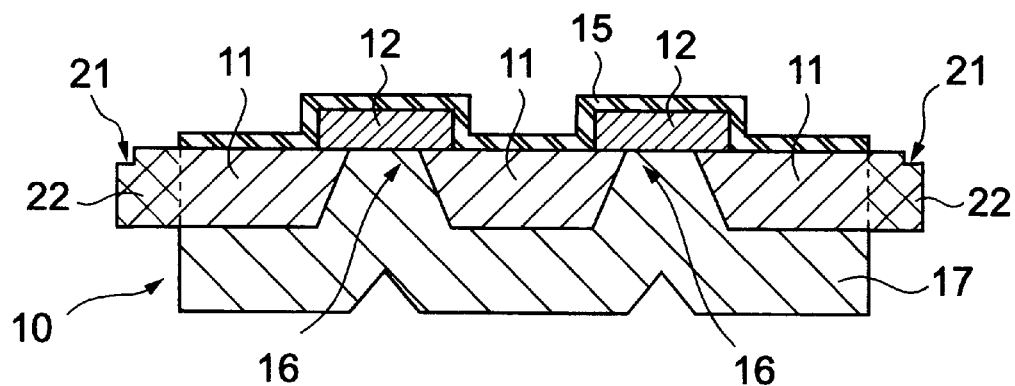

FIGS. 1A and 1B schematically illustrate the structure of a semiconductor device according to one embodiment of the present invention. Specifically, FIG. 1A shows the planar structure, and FIG. 1B shows the cross-sectional structure as viewed along the line A–A' in FIG. 1A.

According to this embodiment, an intended semiconductor device which is to be separated into a chip by a production method to be discussed later is a field effect transistor using a Schottky gate, i.e., a metal-semiconductor-field-effect transistor (hereinafter simply referred to as a "MESFET").

Referring to FIGS. 1A and 1B, reference numeral "10" denotes a chip which constitutes a MESFET, "11" denotes a substrate made of semi-insulating crystal (gallium arsenide (GaAs) in this embodiment) which is used as a semiconductor substrate, "12" is a source electrode, "13" is a drain electrode, "14" is a gate electrode, "15" is a passivation film of, for example, silicon dioxide ($SiO_2$) for chip protection, "16" is an electrode region for contact with the source electrode 12, and "17" denotes a metal film that is formed on the back surface of the substrate 11 in such a way so as to bury the electrode region 16 and serves as a heat sink (which is also referred to as a "plate heat sink" because of its plate-like shape).

Reference numeral "21" denotes a separation groove which is used at the time of separating a semiconductor wafer into individual chips, and "22" denotes a substrate connecting portion which is defined in a portion of the substrate 11 in such a way as to include the separation groove 21. This substrate connecting portion 22, which, together with the separation groove 21, characterizes the present invention, serves to firmly link the individual chips (i.e., serves to retain the alignment of the individual chips) until chip separation, as discussed later.

It should be noted that a thin active layer (n-type semiconductor layer or p-type semiconductor layer) to pass carriers (electrons or holes) is formed on the semi-insulating GaAs substrate, although not particularly illustrated in FIG. 1B, because it is not directly concerned with the subject matter of the present invention, and that the source electrode and drain electrode have ohmic contact with the active layer with the gate electrode having Schottky contact with the active layer.

A method of producing the semiconductor device (MESFET) according to the present embodiment will now be described with reference to FIGS. 2A to 2G.

At the first step (see FIG. 2A), individual semiconductor-device forming portions 10a and 10b, which constitute MESFETs to be separated into chips in a later stage, are formed on the top surface of the semi-insulating GaAs substrate 11 using a known wafer process. At this time, the area at the boundary between the semiconductor-device forming portions 10a and 10b is defined as a scribing region 20. Patterning is performed with respect to the center portion of the scribing region 20 over a predetermined width, and the patterned portion is etched to form the separation groove 21 (for example, about 5 to 40 $\mu$m in width and about 1 to 10 $\mu$m in depth).

At the time of forming the separation groove 21, scribing, dicing or the like may be employed instead of etching, or those schemes may be combined properly as needed.

At the next step (see FIG. 2B), wax, for example, is thermally adhered as a protection film 31 to the top surface of the semiconductor wafer at a temperature of about 150° C. and a support plate 32 of glass or the like is adhered to the protection film 31 using the heat in order to prevent the top surface of the wafer from being damaged at the time of treating the back surface of wafer in a later stage.

At the subsequent step (see FIG. 2C), the semiconductor wafer is turned over for treatment on the back surface of wafer. In this step, the back side of the substrate 11 is polished to be flat and thin to a predetermined thickness (e.g., about 20 to 100 $\mu$m) by mechanical polishing, dry etching or the like.

Figure 2A:
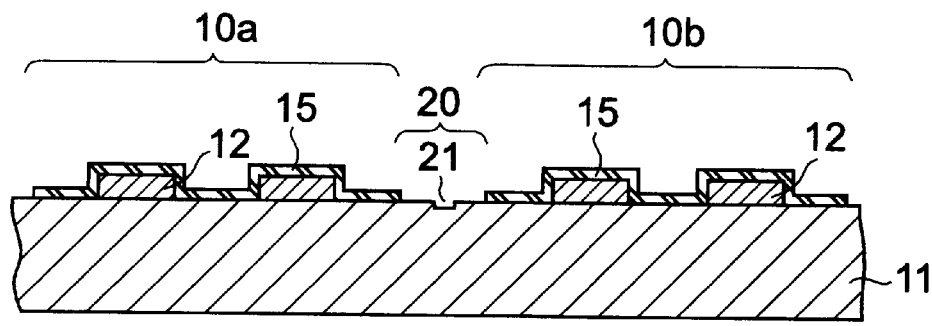
FIGS. 2A through 2G rare cross-sectional views showing, step by step, a method of producing the semiconductor device shown in FIGS. 1A and 1B.
Figure 2B:
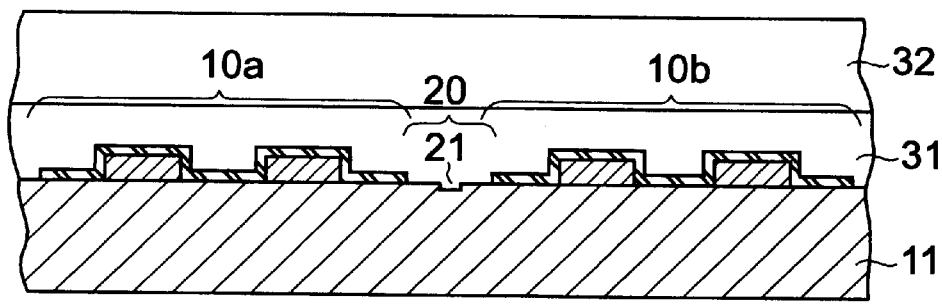
Figure 2C:
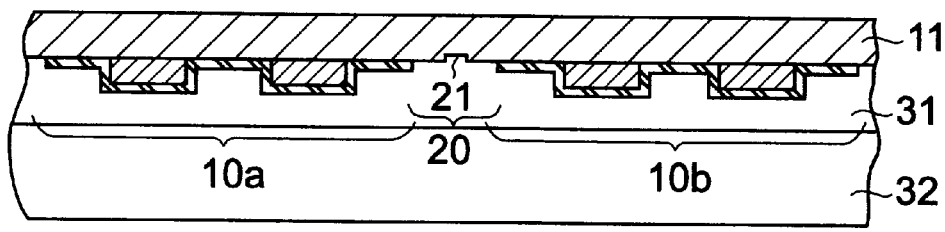
Figure 2D:
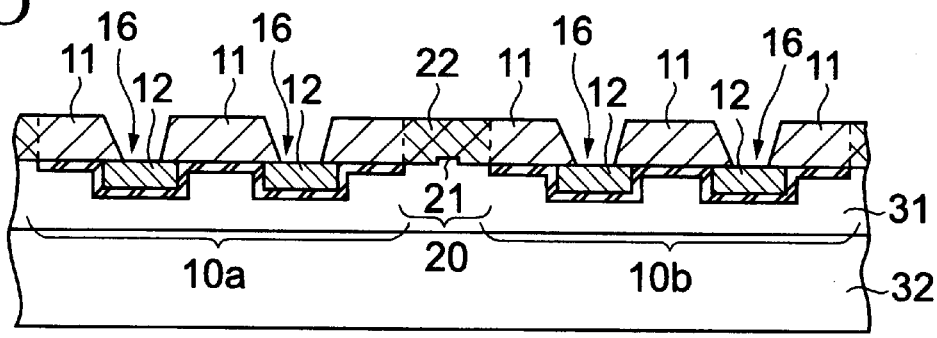
Figure 2E:
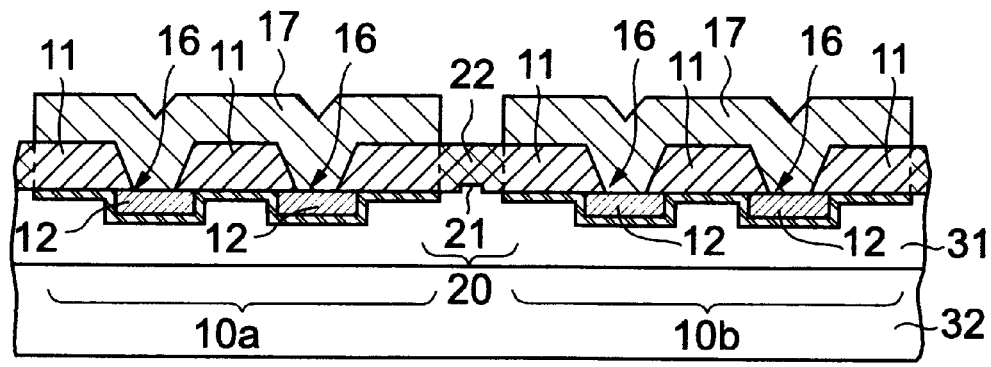
Figure 2F:
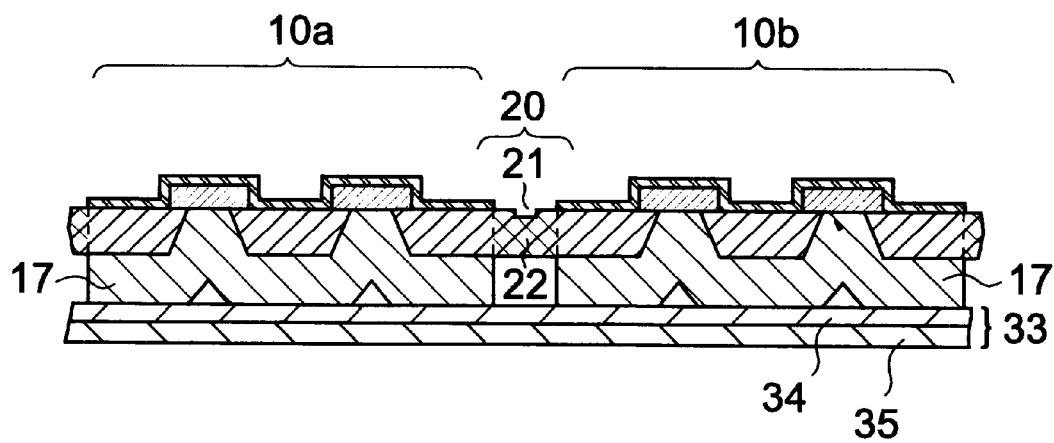

At the next step (see FIG. 2D), a patterned resist (not shown) for forming the electrode regions 16 which is to be contacted with the associated source electrodes 12 is coated on the back surface of the semiconductor wafer, and then the electrode regions 16 are formed by a wet etching using a phosphoric-acid based solution with the resist being used as a mask. At this time, a separation hole is formed in the scribing region 20, leaving a portion of the scribing region 20 in the substrate 11, and this partial region (the cross-hatched portion in FIG. 2D) is defined as the substrate connecting portion 22. The separation hole, though not shown in FIG. 2D, is a portion indicated by reference numerals "41" to "48" in FIGS. 3A through 5C which will be later referred to. After the wet etching, the semiconductor wafer is cleaned using a known method.

At the next step (see FIG. 2E), the metal films 17 of gold (Au) are formed all over the back surface of the substrate 11 and the electrode region 16 at the back of the semiconductor wafer by means of electroplating, and a portion of each metal film 17 corresponding to the scribing region 20 is removed. The individual metal films 17 thus formed serve as plate heat sinks for effectively discharging the heat, generated by the source electrodes 12, to be outside, and are connected to the ground line (not shown) in the present embodiment.

Thereafter, the semiconductor wafer is heated to a proper temperature to melt the wax (protection film 31), to thereby remove the protection film 31 together with the support plate 32 from the semiconductor wafer.

This completes the wafer on which the individual semiconductor-device forming portions 10a and 10b (which are to be separated into the chips 10 in a later stage) are connected to one another and regularly aligned by the substrate connecting portions 22.

At the subsequent step (see FIG. 2F), the semiconductor wafer is turned over again so that the wafer surface comes up, and then an extension tape 33 is adhered to the back of the semiconductor wafer while keeping the alignment of the individual semiconductor-device forming portions 10a and 10b (which are to be separated into the chips 10 in a later stage). This extension tape 33 is formed of a resin 35 of polyimide or the like in which an adhesive 34 that is hardened by irradiation of ultraviolet rays is applied.

At the final step (see FIG. 2G), a slight force is applied to the substrate connecting portions 22 along the separation grooves 21, formed in the corresponding portions of the substrate connecting portions 22, to cut off the substrate connecting portions 22, so that the individual semiconductor-device forming portions 10a and 10b are separated into the chips (semiconductor devices) 10.

In this chip separation, the use of a difference between stresses produced at the interface between the substrate 11 and the metal film 17 (plate heat sinks) can allow the substrate connecting portions 22 to be easily cut off by a slight heat or a force merely applied to the substrate connecting portions 22.

Figure 2G:
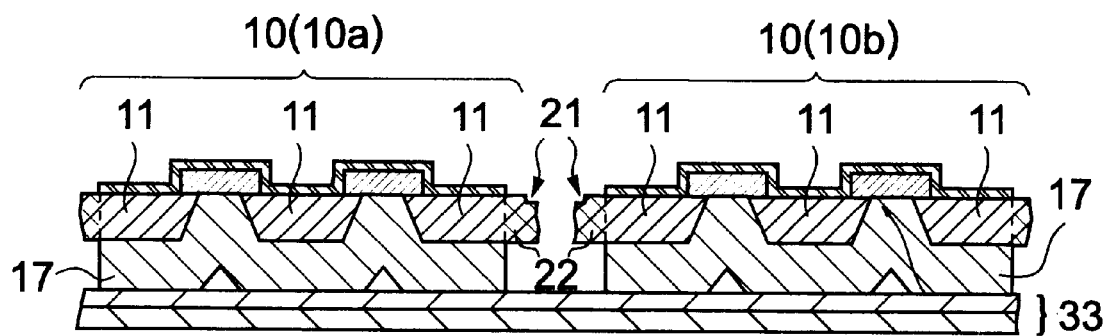

The subsequent process will be carried out in the same manner as in the prior art. Specifically, as a pre-process prior to the assembling process (installment of the chips in packages), as shown in FIG. 2G, the extension tape 33 is stretched horizontally to widen the space between the individual chips 10 and ultraviolet rays are irradiated on the extension tape 33 from above the top surface of the semiconductor wafer to harden the adhesive 34, and then the resultant structure is fed into the automatic chip bonder for assembly.

As described above, according to the semiconductor device producing method of the present embodiment, a portion of the semiconductor substrate 11, which corresponds to a partial region of the scribing region 20 defined at the boundary between the individual semiconductor-device forming portions 10a and 10b, is defined as the substrate connecting portion 22 which firmly links the substrate connecting portions 10a and 10b (that are to be separated into the chips 10 at a later stage). Therefore, the substrate connecting portion 22 has a sufficient strength as a chip linking member. It is thus possible to firmly link the individual chips until chip separation, and also to keep the alignment of the chips until the chips are fed to the automatic chip bonder. This allows the automatic chip bonder to accurately identify each chip position, to thereby assure an efficient installment of the chips into packages. This significantly contributes to improvements in both the working efficiency in the assembling process and the mass-production.

Since the separation groove 21 is formed in the scribing region 20 defined at the portion corresponding to this substrate connecting portion 22, the substrate connecting portion 22 can easily be cut off without applying large stress to the semiconductor wafer by merely applying slight force to the substrate connecting portion 22 along the separation groove 21 at the time of chip separation. In this cut-off process, if a difference between stresses produced at the interface between the substrate 11 and the metal film 17 (plate heat sinks) is used, as mentioned above, the substrate connecting portions 22 can easily be cut by merely applying slight heat or force to the substrate connecting portions 22.

Further, unlike the prior art, since the present embodiment does not require forming a thin film for linkage of chips on the top surface of each chip, each chip size can accordingly be made smaller, and the number of effective chips obtainable from a single semiconductor wafer can be increased. This contributes to a further improvement in the mass-production.

Figure 3A:
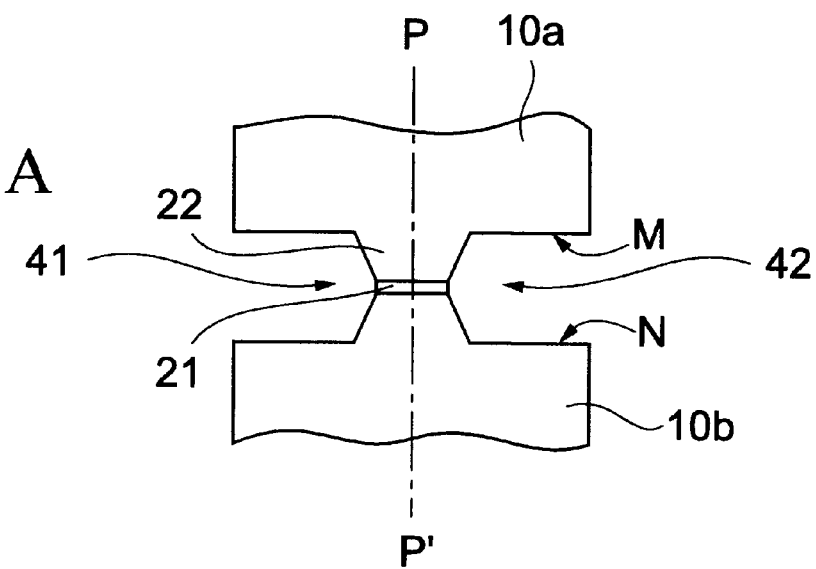
FIGS. 3A through 3C are diagrams exemplarily showing the shape of the substrate connecting portion of the semiconductor device shown in FIGS. 1A and 1B.
Figure 3B:
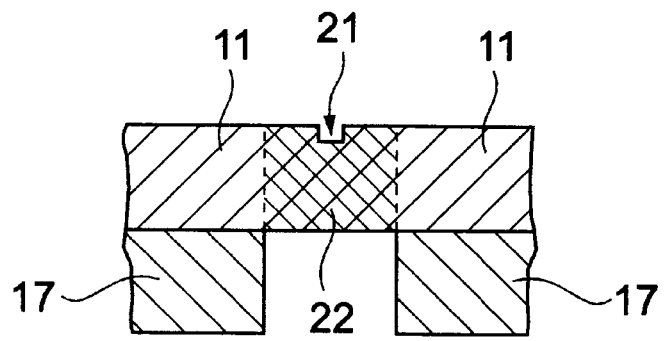
Figure 3C:
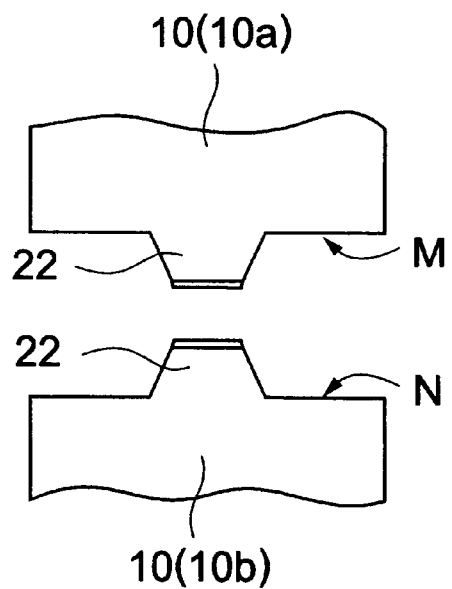

FIGS. 3A through 3C exemplarily show the shape of the substrate connecting portion 22 in the above-described embodiment. Specifically, FIG. 3A shows the planar shape, FIG. 3B shows the cross-sectional shape as viewed along the line P–P' in FIG. 3A, and FIG. 3C shows the shape after a cut-off process.

In this embodiment, the substrate connecting portion 22 is defined so as to link the individual chips (semiconductor-device forming portions 10a, 10b) at the center portions of end faces M and N of the chips, and the separation groove 21 is formed at the center portion of the substrate connecting portion 22 in a direction parallel to the end faces M and N of the chips. It should be noted that the position at which the substrate connecting portion is defined, the shape of the substrate connecting portion, and the location and shape of the separation groove, are not restricted to those described above. For example, the forms as illustrated in FIGS. 4A through 5C may be adopted.

Figure 4A:
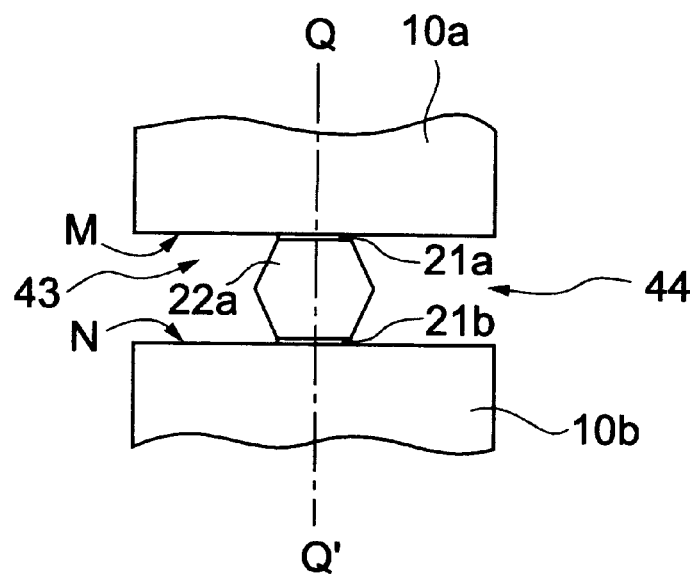
FIGS. 4A through 4C are diagrams exemplarily depicting a modification of the substrate connecting portion.
Figure 4B:
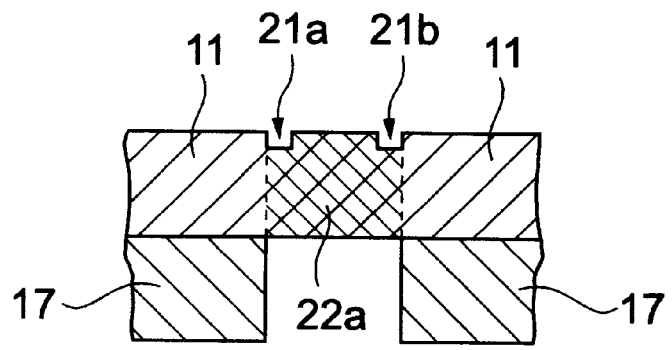
Figure 4C:
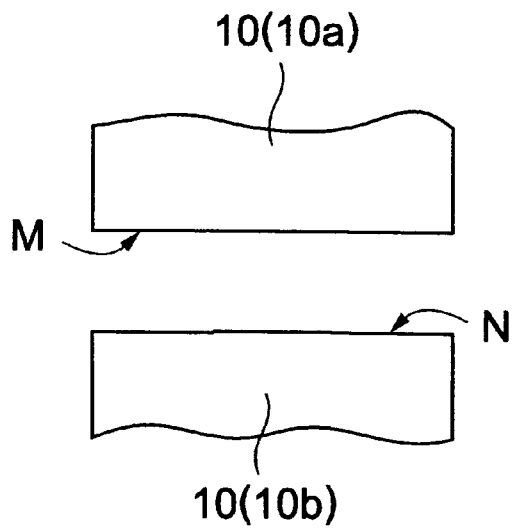

FIGS. 4A through 4C exemplarily depict a modification of the substrate connecting portion. Specifically, FIG. 4A shows the planar shape, FIG. 4B shows the cross-sectional shape as viewed along the line Q–Q' in FIG. 4A, and FIG. 4C shows the shape after a cut-off process.

In this modification, the substrate connecting portion 22a is defined so as to link the individual chips (semiconductor-device forming portions 10a, 10b) at the center portions of end faces M and N of the chips, and separation grooves 21a and 21b are formed in those portions of the substrate connecting portion 22a which coincide with the end faces M and N of the chips.

In this modification, the force applied to the semiconductor wafer (specifically the semiconductor-device forming portions 10a and 10b) in the chip separation is concentrated on the two separation grooves 21a and 21b, so that, as shown in FIG. 4C, the substrate connecting portion 22a can be completely removed from each chip 10 after the cut-off process. Namely, it is possible to prevent an unnecessary portion (a part of the substrate connecting portion 22), as shown in FIG. 3C, from being stuck on the end faces M and N of the chips. This advantageously facilitates a holding of each chip by a pincette, a collet or the like in the assembling process, and assures the scrubbing process (which causes a chip placed on solder to be rocked by a pincette or the like) when each chip is assembled into a package.

Figure 5A:
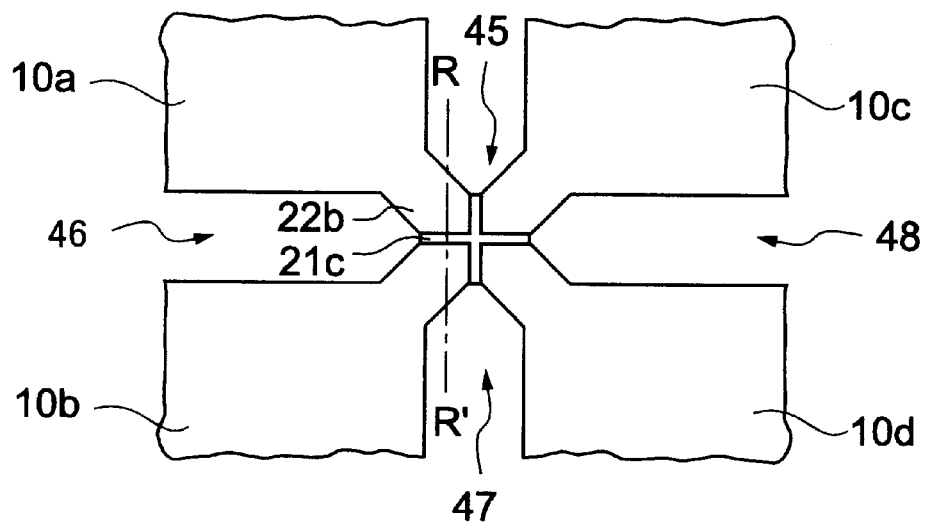
FIGS. 5A through 5C are diagrams exemplarily depicting another modification of the substrate connecting portion.
Figure 5B:
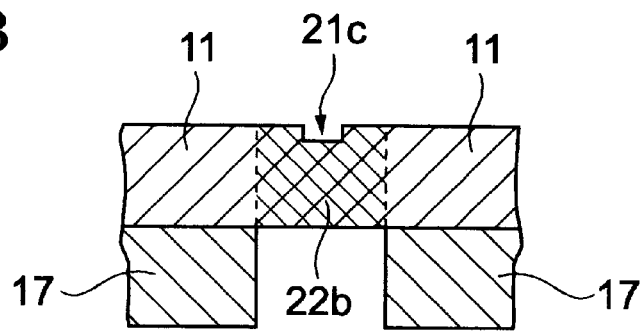
Figure 5C:
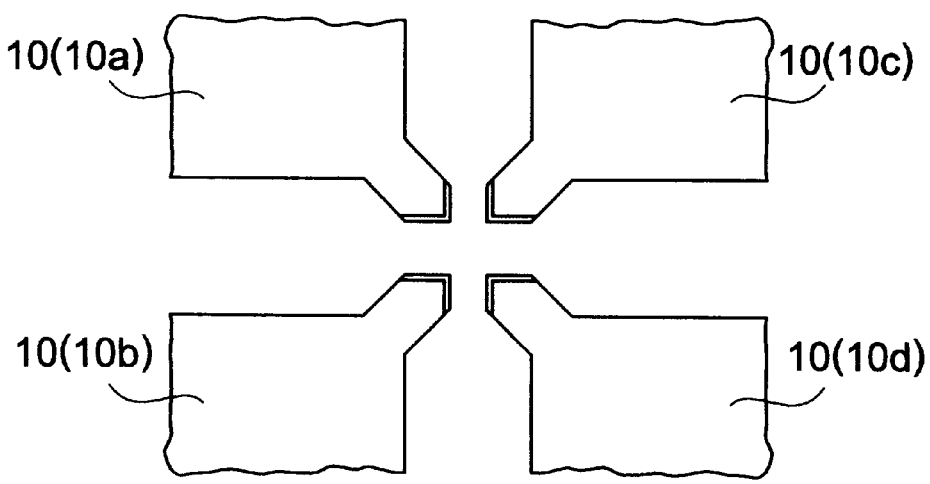

FIGS. 5A through 5C exemplarily illustrate another modification of the substrate connecting portion. Specifically, FIG. 5A shows the planar shape, FIG. 5B shows the cross-sectional shape as viewed along the line R–R' in FIG. 5A, and FIG. 5C shows the shape after a cut-off process.

In this modification, the substrate connecting portion 22b is defined so as to link the corner portions of individual chips (semiconductor-device forming portions 10a, 10b, 10c, 10d), and a separation groove 21c is formed in a cross shape in the center portion of the substrate connecting portion 22b.

In this modification, since the corner portion of each chip is made into a protruding shape by a portion of the substrate connecting portion 22b, it is possible to prevent the corner portions of each chip from being over-etched in the wafer process. Since an unnecessary portion (the substrate connecting portion) does not stick on the end faces of the chips, the scrubbing process can be performed in the same way as done in the modification illustrated in FIGS. 4A–4C.

The foregoing description of the embodiments has been given on the assumption that the surface orientation of the substrate is the same. If the substrate has different surface orientations, however, the strengths of the substrate connecting portions in the chip separation may differ from one another, so that the strengths should be adjusted properly. This can be easily accomplished by adequately changing the shape, size, or number of the substrate connecting portion.

What is claimed is:

1. A method of producing a semiconductor device, said method comprising:
    a first step of forming separation grooves in scribing regions defined at boundary portions between a plurality of semiconductor-device forming portions formed on a top surface of a semiconductor substrate;

a second step of defining portions of said scribing regions in said semiconductor substrate as substrate connection portions containing said separation grooves; and a third step of cutting off said substrate connecting portions along said separation grooves, to thereby separate said plurality of semiconductor-device forming portions into chips.

2. The method as set forth in claim 1, wherein said separation grooves are formed by at least one of etching, scribing and dicing.

3. The method as set forth in claim 1, wherein said second step includes a step of forming electrode regions on a back surface of said semiconductor substrate so as to make contact with electrodes in said semiconductor-device forming portions.

4. The method as set forth in claim 3, wherein said electrode regions are formed by coating a resist having a pattern matching a shape of said electrode regions on said back surface of said semiconductor substrate and performing a wet etching with respect to said semiconductor substrate using said resist as a mask.

5. The method as set forth in claim 3, wherein each of said semiconductor-device forming portions constitutes a metal-semiconductor-field-effect transistor whose source electrode is in contact with an associated one of said electrode regions.

6. The method as set forth in claim 1, further comprising, between said first step and said second step, a step of forming a protection film on said top surface of said semiconductor substrate and a step of polishing said back surface of said semiconductor substrate to be flat to a predetermined thickness.

7. The method as set forth in claim 6, further comprising, after said second step, a step of forming a metal film all over said back surface of said semiconductor substrate and said electrode regions, and removing portions of said metal film which correspond to said scribing regions to thereby form heat sinks for said semiconductor-device forming portions, respectively.

8. The method as set forth in claim 7, wherein said metal film constituting said heat sinks is formed by adhesion of gold by electroplating.

9. The method as set forth in claim 7, further comprising, after said step of forming heat sinks, a step of removing said protection film and a step of adhering an extension tape to said metal film constituting said heat sinks.

10. The method as set forth in claim 9, wherein, at a time of separating said semiconductor-device forming portions into chips, said substrate connecting portions are cut off by utilizing a difference between stresses produced at an interface between said semiconductor substrate and said metal film constituting said heat sinks.

11. The method as set forth in claim 1, wherein said substrate connecting portions are defined so as to link adjoining semiconductor-device forming portions at center portions of opposing end faces of said adjoining semiconductor-device forming portions, and said separation grooves are formed in parallel to said end faces at center portions of said substrate connecting portions.

12. The method as set forth in claim 1, wherein said substrate connecting portions are defined so as to link adjoining semiconductor-device forming portions at center portions of opposing end faces of said adjoining semiconductor-device forming portions, and said separation grooves are formed at those portions of said substrate connecting portions which match with said opposing end faces of said adjoining semiconductor-device forming portions.

13. The method as set forth in claim 1, wherein said substrate connecting portions are defined so as to link corner portions of four adjoining semiconductor-device forming portions, and said separation grooves are formed in a cross shape at center portions of said substrate connecting portions.

14. The method as set forth in claim 1, wherein the shape, size or number of said substrate connecting portions is changed as needed in accordance with a surface orientation of said semiconductor substrate.

15. A semiconductor device produced by a method comprising:

a step of forming separation grooves in scribing regions defined at boundary portions between a plurality of semiconductor-device forming portions formed on a top surface of a semiconductor substrate;

a step of defining portions of said scribing regions in said semiconductor substrate as substrate connecting portions containing said separation grooves; and a step of cutting off said substrate connecting portions along said separation grooves, to thereby separate said plurality of semiconductor-device forming portions into chips.

* * * * *

UNITED STATES PATENT AND TRADEMARK OFFICE
CERTIFICATE OF CORRECTION

PATENT NO. : 6,214,639 B1
DATED : April 10, 2001
INVENTOR(S) : Masaomi Emori et al.

It is certified that error appears in the above-identified patent and that said Letters Patent is hereby corrected as shown below:

<u>Title page,</u>
Item [73], change "Fujitsu Limited, Kawasaki (JP)" to -- Fujitsu Quantum Devices Limited, Nakakoma (JP) --.

Signed and Sealed this

Sixth Day of November, 2001

*Attest:*

NICHOLAS P. GODICI
*Attesting Officer*     *Acting Director of the United States Patent and Trademark Office*